(12) United States Patent
Chen (10) Patent No.: US 9,735,207 B2
(45) Date of Patent: Aug. 15, 2017

(54) DISPLAY SUBSTRATE AND DRIVING METHOD THEREOF, DISPLAY APPARATUS

(71) Applicants: ORDOS YUANSHENG OPTOELECTRONICS CO., LTD., Ordos, Inner Mongolia (CN); BOE TECHNOLOGY GROUP CO., LTD., Beijing (CN)

(72) Inventor: Junsheng Chen, Beijing (CN)

(73) Assignees: ORDOS YUANSHENG OPTOELECTRONICS CO., LTD., Ordos, Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/345,338

(22) PCT Filed: Nov. 12, 2013

(86) PCT No.: PCT/CN2013/086901
§ 371 (c)(1),
(2) Date: Mar. 17, 2014

(87) PCT Pub. No.: WO2014/180104
PCT Pub. Date: Nov. 13, 2014

(65) Prior Publication Data
US 2015/0144893 A1      May 28, 2015

(30) Foreign Application Priority Data
May 10, 2013   (CN) .......................... 2013 1 0173123

(51) Int. Cl.
*H01L 27/32*     (2006.01)
*G09F 9/33*      (2006.01)
(Continued)

(52) U.S. Cl.
CPC ............ *H01L 27/3218* (2013.01); *G09F 9/33* (2013.01); *G09G 3/3208* (2013.01);
(Continued)

(58) Field of Classification Search
CPC ............ H01L 27/3218; H01L 27/3216; G09G 3/3208; G09G 2340/0457;
(Continued)

(56) References Cited

U.S. PATENT DOCUMENTS 7,471,274 B2 * 12/2008 Kim ................. G02F 1/134309
                                                            345/88
8,130,175 B1    3/2012 Joffer et al.
(Continued)

FOREIGN PATENT DOCUMENTS

CN          201004298 Y      1/2008
CN          201638818 U     11/2010
(Continued)

OTHER PUBLICATIONS

International Search Report Appln. No. PCT/CN2013/086901; Dated Feb. 27, 2014.
(Continued)

*Primary Examiner* — Latanya N Crawford
(74) *Attorney, Agent, or Firm* — Ladas & Parry LLP (57) ABSTRACT

A display substrate and a driving method thereof, and a display apparatus are provide. The display substrate includes an array of a plurality of sub-pixels having at least two colors, wherein the sub-pixels of each color constitute a plurality of sub-pixel sets, each of the sub-pixel sets includes at least two sub-pixels of the same color and arranged adjacently in a first direction, and sub-pixel sets of different colors are arranged alternately in the first direction. The display substrate may be applied to display devices, particularly to organic light emitting diode display devices using
(Continued)

different organic light emitting layer materials for different sub-pixels.

20 Claims, 4 Drawing Sheets

(51) Int. Cl.
H05B 33/08 (2006.01)
G09G 3/3208 (2016.01)
(52) U.S. Cl.
CPC . *H05B 33/0896* (2013.01); *G09G 2300/0443* (2013.01); *G09G 2300/0452* (2013.01); *G09G 2340/0457* (2013.01)
(58) Field of Classification Search
CPC ... G09G 2300/0452; G09G 2300/0443; H05B 33/0896; G09F 9/33
See application file for complete search history.

(56) References Cited

U.S. PATENT DOCUMENTS

| | | | | |
|---|---|---|---|---|
| 8,872,797 | B2* | 10/2014 | Lee | G06F 3/0412 345/175 |
| 2005/0099378 | A1* | 5/2005 | Kim | G02F 1/134309 345/99 |
| 2005/0151462 | A1 | 7/2005 | Miyagawa | |
| 2006/0033422 | A1* | 2/2006 | Chao et al. | 313/500 |
| 2007/0001954 | A1* | 1/2007 | Shishido et al. | 345/89 |
| 2007/0024183 | A1 | 2/2007 | Lih et al. | |
| 2007/0236134 | A1* | 10/2007 | Ho | H01L 27/3213 313/500 |
| 2008/0001536 | A1 | 1/2008 | Tsai et al. | |
| 2009/0121983 | A1 | 5/2009 | Sung et al. | |
| 2011/0050645 | A1* | 3/2011 | Lee | G06F 3/0412 345/175 |
| 2011/0127506 | A1 | 6/2011 | So | |
| 2012/0032947 | A1 | 2/2012 | Phan et al. | |
| 2013/0021328 | A1* | 1/2013 | Yang | H04N 13/0422 345/419 |

FOREIGN PATENT DOCUMENTS

| | | |
|---|---|---|
| CN | 202033972 U | 11/2011 |
| CN | 103280162 A | 9/2013 |

OTHER PUBLICATIONS

First Chinese Office Action Appln. No. 201310173123.0; Dated Sep. 24, 2014.

Written Opinion of the International Searching Authority dated Feb. 12, 2014; PCT/CN2012/086901.

Extended European Search Report dated Oct. 18, 2016; Appln. No. 13834353.8-1903/2996106 PCT/CN2013086901.

* cited by examiner

DISPLAY SUBSTRATE AND DRIVING METHOD THEREOF, DISPLAY APPARATUS

TECHNICAL FIELD

Embodiments of the present invention relate to a display substrate and a driving method thereof, as well as a display apparatus.

BACKGROUND

Figure 1:
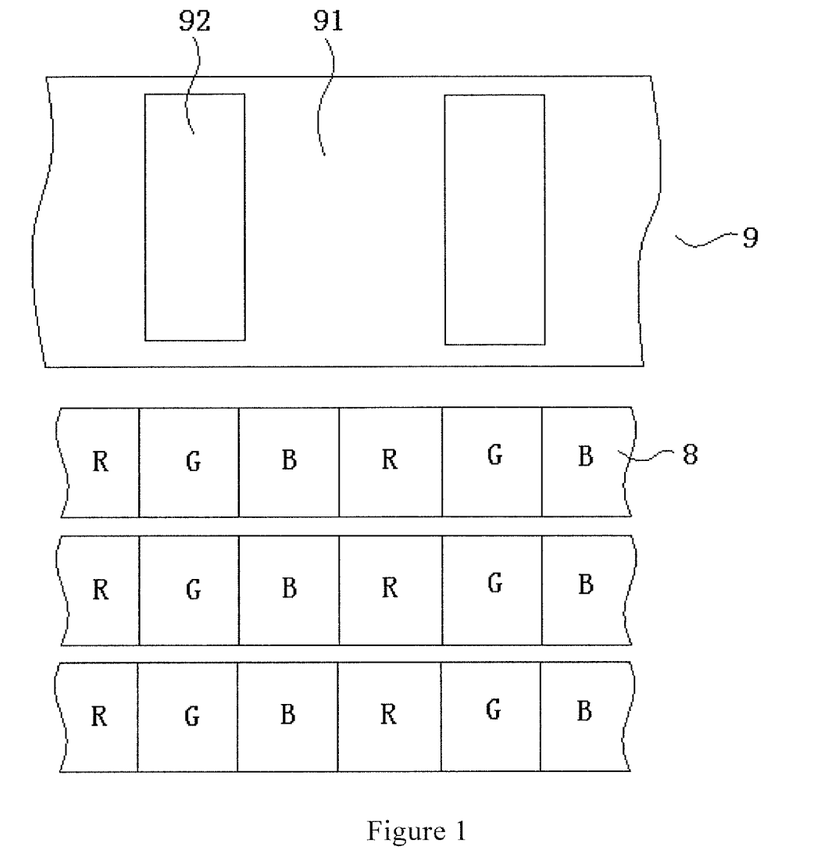
FIG. 1 is a schematic diagram illustrating the correspondence between an evaporation mask and conventional sub-pixels.

As shown in FIG. 1, each pixel unit 1 of an organic light emitting diode (OLED) display device (i.e., a "dot" on the display screen) consists of a plurality of adjacent sub-pixels 8 in a same line, while each sub-pixel 8 includes one light emitting diode (LED). various sub-pixels 8 emit light of different colors (for example, in RGB mode, each pixel unit 1 consists of three sub-pixels R, G and B emitting red, green and blue light). To allow sub-pixels 8 to emit light of different colors, one way is to make all sub-pixels 8 of an OLED to emit white light and filters of different colors are disposed in sub-pixels 8 for filtering at the same time; however, a more typical method is to use different organic light emitting layer materials in organic light emitting diodes of different sub-pixels 8, allowing the organic light emitting diodes to emit light of different colors directly.

For an OLED display device using different organic light emitting layer materials for various sub-pixels 8, it is understood that organic light emitting layers of sub-pixels 8 of different colors need to be manufactured separately in different evaporation processes (however, other structures such as electrodes in sub-pixels 8 may be formed at the same time). As shown in FIG. 1, when evaporating an organic light emitting layer of a sub-pixel 8 of a certain color, a barrier section 91 of the evaporation mask 9 (FFM) is used to shield other sub-pixels 8, so as to allow the organic light emitting layer material to be deposited on the desired sub-pixel 8 via an opening 92 (in the column direction, sub-pixels 8 of the same color are aligned in one column, and their organic light emitting layers are connected together, thus no barrier section 91 is needed).

Figure 2:
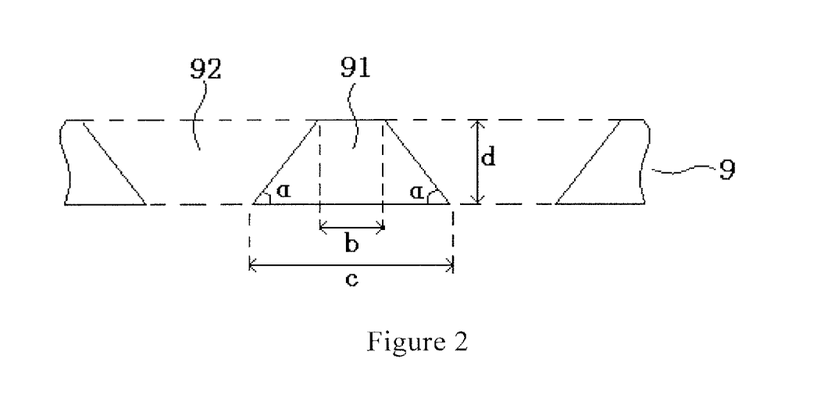
FIG. 2 is a sectional structural schematic view of an evaporation mask.

As shown in FIG. 2, the barrier section 91 has a width $c=(b+2d\times\tan\alpha)$, wherein b is a width of the middle part of the barrier section 91, d is the thickness of the evaporation mask 9 and $\alpha$ is the slope angle of the barrier section 91. In order to guarantee a good shielding effect, $\alpha$ of the evaporation mask 9 is generally kept at 40~60 degrees. At the same time, due to the limitations of the conventional manufacturing process, it is difficult to obtain d less than 30 μm. Therefore the minimum value of the width of the barrier section 91 is also limited. Since the width of the barrier section 91 is the space between sub-pixels 8 of the same color (for RGB mode, it is the width of two sub-pixels 8), limitation on minimum width of the barrier section 91 is equivalent to the limitation on minimum size of the sub-pixel 8, resulting in limitation on resolution (the number of pixel units 1 per unit size), and hence impacting on the display quality.

Figure 3:
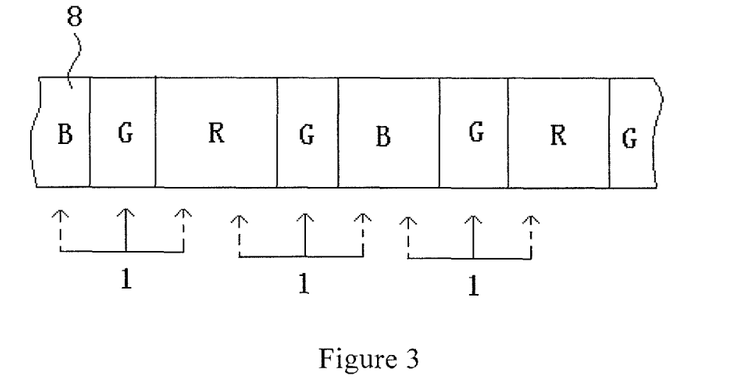
FIG. 3 is a schematic diagram of pixel units division in one row of sub-pixels in a conventional Pentile arrangement.

In order to improve the resolution of an OLED display device, a Pentile arrangement of sub-pixels 8 has been developed. In the Pentile arrangement, as shown in FIG. 3, the number of red and blue sub-pixels R and B is reduced by one half, and every red and blue sub-pixel R, B is "shared" by two pixel units 1. As such, it is possible to increase the number of pixel units 1 and enhance to increase the resolution while keeping the number of the sub-pixels 8 unchanged. Obviously, in the Pentile arrangement, the number of part of the sub-pixels 8 (such as red and blue sub-pixels R, B) is reduced and the shared sub-pixels 8 can not display contents of two pixel units 1 accurately at the same time, it is necessary to adjust areas of some sub-pixels 8 (for example, enlarge areas of red and blue sub-pixels R and B) incorporating with certain display algorithms (i.e., algorithms for calculating gray-scales of sub-pixels 8) to guarantee that the display quality is not degraded.

The inventor notices at least the following problems in conventional technology: the size of sub-pixels in Pentile arrangement is stilled limited by the barrier area width of the evaporation mask, and the size of sub-pixels is not decreased (some even get larger), that is, this arrangement cannot improve the resolution of an OLED display device essentially.

SUMMARY

Embodiments of the present invention provide a display substrate, a display apparatus and a display method with high resolution.

According to a first aspect of the present invention, a display substrate is provided, comprising an array of a plurality of sub-pixels having at least two colors, wherein the sub-pixels of each color constitute a plurality of sub-pixel sets, each of the sub-pixel sets includes at least two sub-pixels of the same color and arranged adjacently in a first direction, and sub-pixel sets of different colors are arranged alternately in the first direction.

The first direction is a row or column direction.

In an example, numbers of sub-pixels included in each of the sub-pixel sets are identical.

In an example, each of the sub-pixel sets comprises two sub-pixels.

In an example, the sub-pixel sets of different colors are arranged alternately in the row direction; and the sub-pixel sets of different colors are arranged alternately in the column direction.

In an example, said display substrate is an OLED display substrate, each of said sub-pixels includes an OLED, OLEDs of sub-pixels with different colors have organic light emitting layers of different materials, and OLEDs of sub-pixels with the same color have organic light emitting layers formed in a single evaporation process.

According to another aspect of the present invention, a method of driving the above described display substrate is provided, comprising: providing a driving signal for respective sub-pixels, so that they constitute a plurality of pixel units for displaying, wherein each of the pixel units includes one sub-pixel of each respective colors arranged in a first direction.

In an example, said first direction is the row or column direction.

In an example, at least some of the sub-pixels are shared by two adjacent pixel units.

In an example, the display substrate includes sub-pixels of three colors; and each pixel unit includes two adjacent sub-pixels and one sub-pixel spaced apart by one sub-pixel from said two adjacent sub-pixels.

In an example, any one sub-pixel only belongs to one pixel unit.

In an example, a plurality of sub-pixels of each pixel unit are located in a plurality of adjacent sub-pixel sets, respectively.

According to yet another aspect of the present invention, a display apparatus is provided, comprising: the above described display substrate.

The present invention may be applied to display devices, particularly to organic light emitting diode display devices using different organic light emitting layer materials for different sub-pixels.

BRIEF DESCRIPTION OF THE DRAWINGS

Embodiments of the present invention will be described in more detail below with reference to the accompanying drawings to allow one of ordinary skill in the art to understand the present invention more clearly, in which:

FIG. 5-1 is a diagram illustrating another mosaic-like arrangement of sub-pixel sets of the display substrate according to an embodiment of the present invention;

FIG. 5-2 is a diagram illustrating yet another mosaic-like arrangement of sub-pixel sets of the display substrate according to an embodiment of the present invention;

Reference numerals in figures are: 1, pixel unit; 8, sub-pixel; 81, sub-pixel set; 9, evaporation mask; 91, barrier section; and 92, opening.

DETAILED DESCRIPTION OF THE PREFERRED EMBODIMENTS

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments and variants can be obtained by those of ordinary skill in the art without creative labor and those embodiments and variants shall fall into the protection scope of the present invention.

Unless otherwise defined, all the technical and scientific terms used herein have the same meanings as commonly understood by one of ordinary skill in the art to which the present invention belongs. The terms, such as "first," "second" or the like, which are used in the description and the claims of the present application, are not intended to indicate any sequence, amount or importance, but for distinguishing various components. Also, the terms, such as "a/an," "one," "the/said" or the like, are not intended to limit the amount, but for indicating the existence of at lease one. The terms, such as "comprise/comprising," "include/including" or the like, are intended to specify that the elements or the objects stated before these terms encompass the elements or the objects and equivalents thereof listed after these terms, but not preclude other elements or objects. The terms, such as "On," "under," or the like, are only used to indicate relative position relationship, and when the position of the object which is described is changed, the relative position relationship may be changed accordingly.

According to an embodiment of the present invention, the display substrate includes an array of a plurality of sub-pixel of at least two colors, and sub-pixels of each color constitute a plurality of sub-pixel sets. Each of the sub-pixel sets includes at least two sub-pixels of the same color and arranged adjacently in a first direction, and sub-pixel sets of different colors are arranged alternately in the first direction. The first direction is the row or column direction. Herein, "the first direction" refers to the row or column direction, that is, if sub-pixels in each sub-pixel set are arranged adjacently in one row (the first direction is the row direction), sub-pixel sets of different colors are also arranged alternately in one row; if sub-pixels in each sub-pixel set are arranged adjacently in one column (the first direction is the column direction), sub-pixel sets of different colors are also arranged alternately in one column.

As shown in FIGS. 4 to 8, the display substrate includes a substrate (e.g., a glass substrate, a quartz substrate, or a plastic substrate), and a plurality of sub-pixels 8 arranged on the substrate, which are arranged in matrix/array and include at least two colors.

The display substrate of this embodiment is a RGB mode, for example, namely, it includes three types of sub-pixels 8, red (R), green (G) and blue (B).

Sub-pixels 8 of each color constitute a plurality of "sub-pixel sets 81", and each includes at least two sub-pixels 8 of the same color and arranged adjacently in the same row; sub-pixel sets 81 of different colors are arranged alternately (for example, in a pattern of "red sub-pixel set 81—green sub-pixel set 81—blue sub-pixel set 81—red sub-pixel set 81" or other sequential cycling pattern) into a row or a column. This embodiment is described with respect to the case in which sub-pixel sets 81 of different colors are alternately arranged into one row.

As can be seen in the figure, sub-pixels 8 are arranged in a unit of "sub-pixel set 81", that is, sub-pixels 8 of each color are no longer arranged individually, but arranged in sets or groups. Thus, the number of sub-pixels 8 between sub-pixels 8 of the same color (or sub-pixel sets 81) is increased.

In an embodiment, every sub-pixel set 81 includes the same number of sub-pixels 8. In this way, the total number of sub-pixels 8 of various colors is the same. Therefore, algorithm for display with them is relatively simple, and an overall color deviation due to different number of sub-pixels 8 of a certain color and sub-pixels 8 of other colors need not be considered.

In an embodiment, each sub-pixel set 81 includes two sub-pixels 8. Since contents displayed by sub-pixels 8 in a pixel unit 1 need to be mixed to become a visible dot on the display screen, distances between sub-pixels 8 in one pixel unit 1 can not be too large, that is, the number of sub-pixels 8 in each sub-pixel set 81 cannot be too large. For example, each sub-pixel set 81 includes two sub-pixels 8. As such, it is easy to mix light during display and the display effect is good. It is understood that the above color modes of sub-pixels 8 and the number of sub-pixels 8 in each sub-pixel set 81 are only as examples, and other different forms may be used. For example, colors for sub-pixels 8 may also be of RGBW mode (red, green, blue and white) or RGBY mode (red, green, blue and yellow), while each sub-pixel set 81 may include three or more sub-pixels 8.

Figure 4:
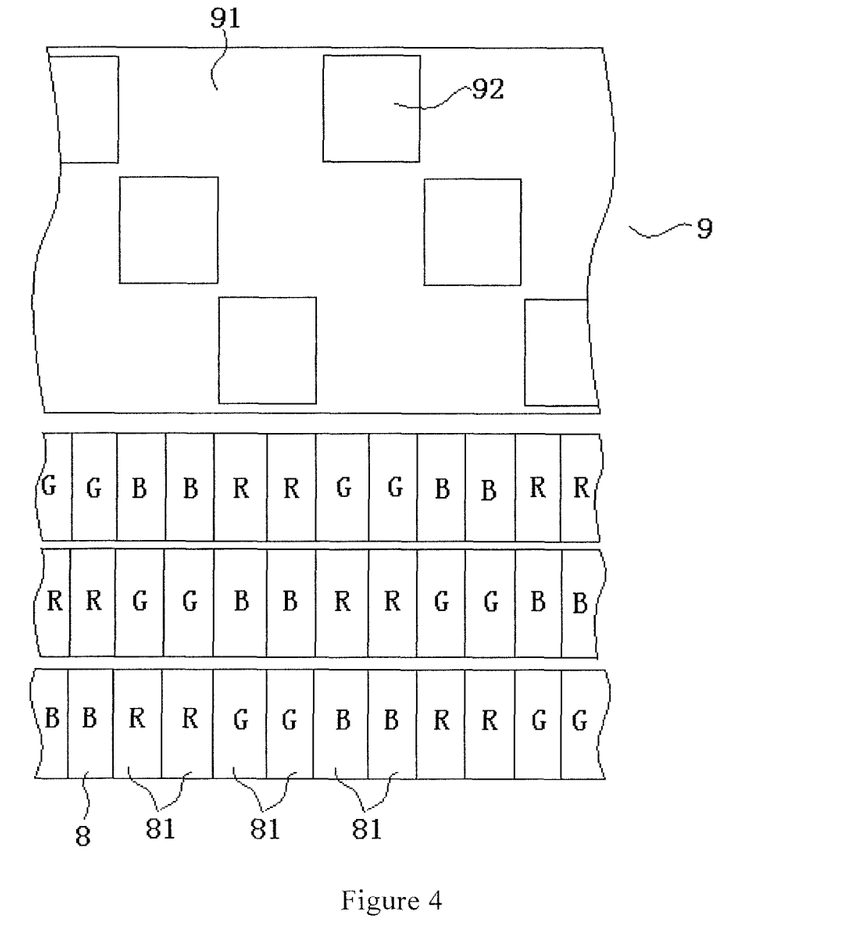
FIG. 4 is a schematic diagram showing correspondence between an evaporation mask and sub-pixels of an display substrate of an embodiment of the present invention, wherein a mosaic-like arrangement of sub-pixel sets of the substrate is shown at the same time.
Figure 6:
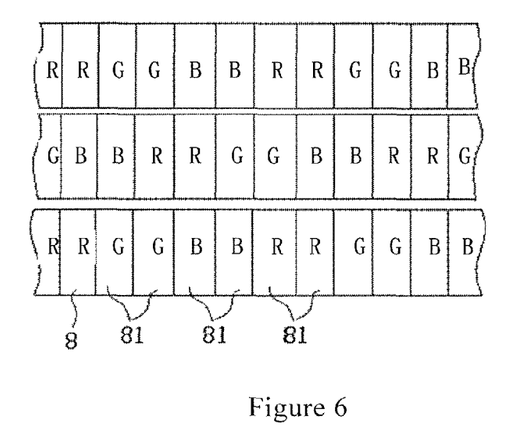
FIG. 6 is a diagram illustrating another arrangement of sub-pixel sets of the display substrate according to an embodiment of the present invention.

In an embodiment, as shown in FIG. 4, sub-pixel sets 81 of various colors in the column direction are arranged alternately. That is, unlike the conventional technology, in the display substrate of this embodiment, the colors of the same column of sub-pixels 8 also change alternately rather than being the same color, namely, with a sub-pixel set 81 as a repetition unit, sub-pixel sets 81 of various colors may be arranged in a mosaic-like manner, which means sub-pixel sets 81 of the same color are not adjacent. For example, if the arrangement for the $i^{th}$ row of sub-pixel sets 81 is cycling as "red sub-pixel set 81—green sub-pixel set 81—blue sub-pixel set 81—red sub-pixel set 81", the arrangement for the $i+1^{th}$ row of sub-pixel sets 81 may be cycling as "green sub-pixel set 81—blue sub-pixel set 81—red sub-pixel set 81—green sub-pixel set 81", and so on. It is understood that the arrangement order of sub-pixel sets 81 of various colors in the column direction may be the same as or different from the arrangement order of sub-pixel sets 81 of various colors in the row direction, and the present invention is not limited thereto. By alternately changing colors of sub-pixels 8 in row direction and column direction, the overall light mixing may be more uniform to achieve better display effect.

Figure 51:
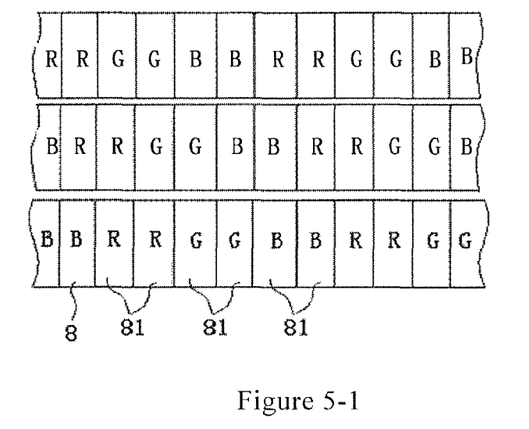
Figure 52:
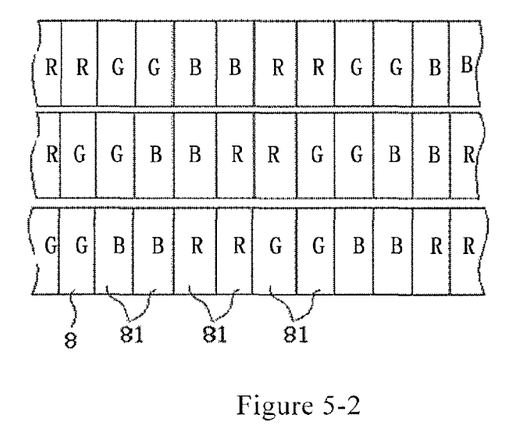

Furthermore, the arrangement of sub-pixel sets 81 can also be another type of mosaic-like arrangement, that is, each row of sub-pixel sets 81 are disposed staggered by a distance of one sub-pixel 8 with respect to the adjacent row(s) of sub-pixel sets 81. Referring to FIGS. 5-1 and 5-2, for example, if the arrangement of the $i^{th}$ row is a repetition of RRGGBB, the arrangement for the $i+1^{th}$ row may be BRRGGB (see FIG. 5-1) or RGGBBR (see FIG. 5-2), accordingly. The arrangement for sub-pixel sets 81 may also be a triangle arrangement, that is, sub-pixel sets of three colors form a shape of a triangle. For example, referring to FIG. 6, if the arrangement of the $i^{th}$ row is a repetition of RRGGBB, then the arrangement for the $i+1^{th}$ row is GBBRRG. In this arrangement, a single individual sub-pixel 8 rather than a sub-pixel set 81 may appear at the beginning and the end of some rows (odd numbered rows or even numbered rows). The present invention is not limited to these arrangements, but it can have many variants.

In an embodiment, the display substrate is an organic light emitting diode (OLED) display substrate in which each sub-pixel 8 is provided with an OLED, which includes a cathode, an organic light emitting layer, and an anode. And the organic light emitting layers in OLEDs of sub-pixels 8 of different colors are made of different materials. By means of the way in which sub-pixels 8 of the same color constitute sub-pixel set(s) 81 in this embodiment, organic light emitting layers in OLEDs of sub-pixels 8 of the same color may be formed in one evaporation process, so that the evaporation process can be simplified. At the same time, the problem that resolution cannot be improved significantly due to the limitation of evaporation mask preparation process may be addressed. The OLED display substrate may further include other known features, such as gate lines, data lines, thin film transistor driving array, pixel defining layer (PDL), which are not described in detail herein.

Referring to FIG. 4 again, embodiment(s) of the present invention will be described with sub-pixel sets 81 arranged in mosaic-like manner as an example, that is, a sub-pixel set 81 of each color is surrounded by sub-pixel sets 81 of other colors. In the evaporation process of the display substrate of this embodiment, each barrier section 91 of the evaporation mask 9 corresponds to four (two sets of) sub-pixels 8. Thus, for constant width of barrier section 9, the width of each sub-pixel 8 can be reduced to a half of that of the conventional technology (since in the mask used in conventional technology, each barrier section 91 may correspond to two sub-pixels 8 in embodiment(s) of the present invention), such that the size of the sub-pixels 8 is practically reduced, resulting in an improved resolution. At the same time, an opening 92 of the evaporation mask 9 may also correspond to two sub-pixels 8 (that is, organic light emitting layers of OLEDs of adjacent sub-pixels 8 of the same color are connected together), therefore the size of openings 92 can be larger, which facilitates the manufacture. Since the colors of sub-pixels 8 in the column direction in the display substrate of this embodiment vary, the corresponding openings 92 may also be divided into a plurality of segments staggered by a distance of one sub-pixel set 81.

In the display substrate of embodiments of the present invention, sub-pixels 8 are arranged in a unit of "set", therefore the number of sub-pixels 8 between sub-pixels 8 of the same color increases, the number of sub-pixels 8 corresponding to each barrier section 91 increases. Thus, under the condition that the width of barrier sections 91 is constant, the size of each sub-pixel 8 (width and/or height) can be reduced and the resolution is improved.

Although embodiments of the present invention have been described with respect to an OLED display substrate, the structure of these embodiments may also be applied to other display substrates, such as OLED display substrates using color filters or liquid crystal display (LCD) substrates.

Since the structure of the display substrate in embodiments of the present invention has been changed, its driving method (or division of the pixel units 1) will also be changed in some extent.

According to embodiment(s) of the present invention, the method of driving the above described display substrate(s) includes: providing a driving signal for respective sub-pixels, so that they constitute a plurality of pixel units for displaying, and each pixel unit includes one sub-pixel of each color arranged in a first direction. Here, "all sub-pixels of a pixel unit are arranged in a first direction" means that the arrangement direction of all sub-pixels in the same pixel unit is also the first direction; that is, if sub-pixels in each sub-pixel set are arranged adjacently in one row (the first direction is the row direction), all sub-pixels in one pixel unit are also located in one row; while if sub-pixels in each sub-pixel set are arranged adjacently in one column (the first direction is the column direction), all sub-pixels in one pixel unit are also located in one column.

The method of driving the display substrate in embodiments of the present invention includes: providing a driving signal for respective sub-pixels 8, so that each pixel unit 1 composed of the sub-pixels 8 includes one sub-pixel 8 of each respective colors for displaying, and the sub-pixels 8 in each pixel unit 1 are arranged in the first direction. It is to be understood that the display of the pixel unit 1 is the result of mixing contents (for example, in terms of color and brightness) of the driven and displayed respective sub-pixels 8, therefore, the display of the pixel unit 1 is not only depended on the type and number of the composed sub-pixels 8, but also on the form of their combination. Driving signals for sub-pixels 8 of different combinations to constitute the pixel unit 1 are also different.

That is, each row of sub-pixels 8 are divided into a plurality of pixel units 1, and the respective sub-pixels 8 therein are provided with driving signal(s) according to the colors required by the pixel units 1, and each row of the sub-pixels 8 are grouped into a plurality of pixel units 1. For example, there is only one sub-pixel 8 of each respective colors in every pixel unit 1. In an embodiment, each pixel unit 1 includes one red (R) sub-pixel 8, one green (G) sub-pixel 8 and one blue (B) sub-pixel 8.

In an embodiment, a plurality of sub-pixels 8 of each pixel unit 1 are located in a plurality of adjacent sub-pixel sets 81 respectively. As aforesaid, since the plurality of sub-pixels 8 in one pixel unit 1 are required to be mixed in color, it is inadvisable for these sub-pixels 8 to be spaced apart too far, i.e., the plurality of sub-pixels 8 in one pixel unit 1 are generally selected from nearby sub-pixel sets 81.

For example, at least some of the sub-pixels 8 are shared by two pixel units 1. That is, sub-pixels 8 in the display substrate in embodiments of the present invention may also be shared in a way as that in the Pentile arrangement. In embodiments of the present invention, it is also possible that at least some of the sub-pixels 8 only present in one pixel unit 1. For example, in each row of sub-pixels 8, some sub-pixels 8 at the beginning and the end of the row need not to be shared with other pixel units 1 and are only driven when one pixel unit 1 is displaying; or in other arrangements or driving method, some middle sub-pixels 8 may also be driven only when one pixel unit 1 is displaying and need not be shared by two pixel units 1, and the present invention is not limited thereto.

Figure 7:
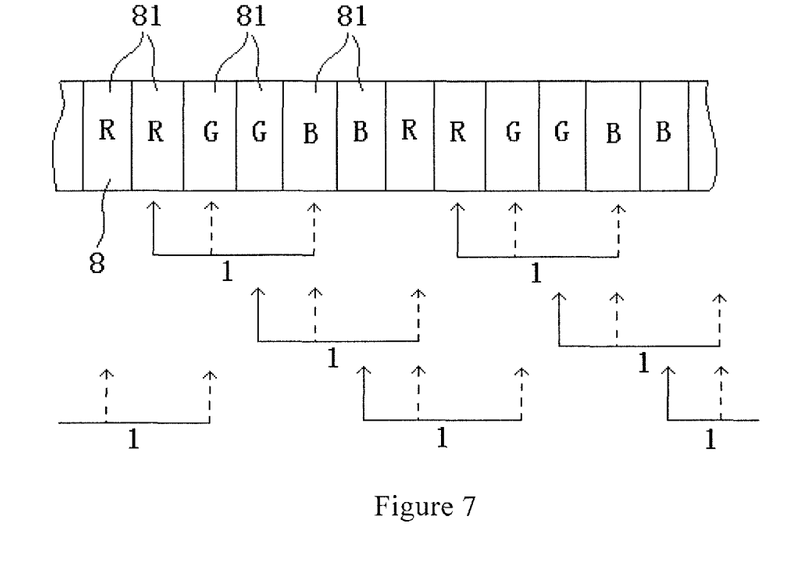
FIG. 7 is a schematic diagram illustrating pixel units division in one row of sub-pixels of the display substrate of embodiment 1 of the present invention.

As illustrated in FIG. 7, according to an embodiment, for a display substrate in RGB mode, each pixel unit 1 includes two adjacent sub-pixels 8 and a sub-pixel 8 spaced apart from these two adjacent sub-pixels 8 by one sub-pixel 8. That is, as shown in FIG. 7, sub-pixels 8 are shared in a way of "every other" mode. Since there is only one sub-pixel 8 of each respective colors in each pixel unit 1, the above described two adjacent sub-pixels 8 of the first color (for example, R) and the second color (for example, G) belong necessarily to two adjacent sub-pixel sets 81 respectively. Together with the sub-pixel 8 of the third color (for example, B) spaced apart from these two adjacent sub-pixels 8 of the first color (for example, R) and the second color (for example, G) by one sub-pixel 8 and located to their right, these three sub-pixels 8 constitute one pixel unit. The above described sharing mode of sub-pixels 8 can achieve excellent color mixing effect, resulting in better display effect.

What has been described above is only an illustrative sharing mode of sub-pixels 8, other modes of sharing sub-pixels 8 may also be used.

For example, any one sub-pixel 8 may also belong to only one pixel unit 1, that is, sub-pixels 8 are not shared.

Figure 8:
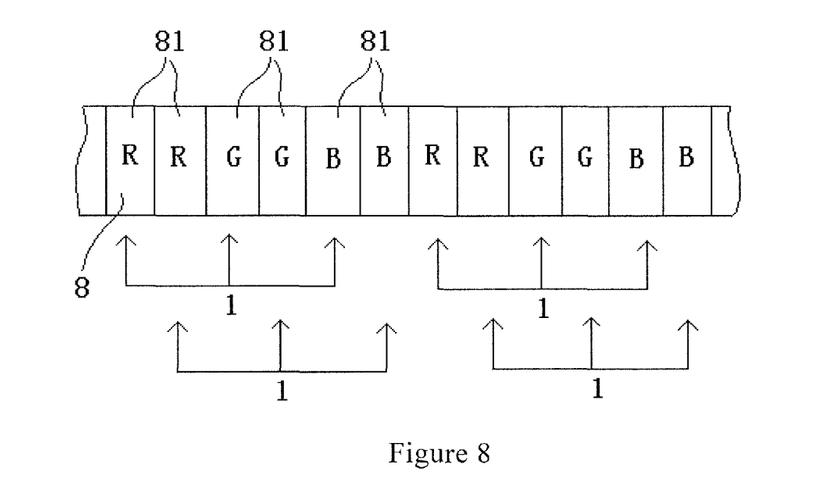
FIG. 8 is a schematic diagram illustrating another pixel units division in one row of sub-pixels of the display substrate of embodiment 1 of the present invention.

For example, as shown in FIG. 8, the six sub-pixels 8 in three adjacent sub-pixel sets 81 may belong to two pixel units 1 respectively, each pixel unit 1 includes three sub-pixels 8 and no sub-pixels 8 are shared.

It is to be understood that the sub-pixel set 81 may also be constituted of adjacent sub-pixels 8 of the same color in the same column, though embodiments of the present invention are described by a sub-pixel set 81 is constituted of adjacent sub-pixels 8 of the same color in the same row. For example, adjacent two sub-pixels 8 of the same color in each column constitute one sub-pixel set 81, a plurality of sub-pixel sets 81 of different colors are arranged alternately to form a column, and at the same time, in the row direction, a plurality of sub-pixel sets 81 of different colors are also arranged alternately, i.e., forming a mosaic-like arrangement. For this type of arrangement, its driving method is also similar to the above described driving method, that is, sub-pixels 8 may also be shared in an every other mode, or in a mode of three adjacent sub-pixel sets 81 forming two pixel units 1 and other modes to be driven, which will not be described in detail.

According to embodiments of the present invention, a display device is also provided including the described display substrate(s). The display device may be any products or parts with display function, such as LCD panels, electronic papers, OLED panels, mobile phones, flat computers, televisions, displays, notebook computers, digital picture frames, and navigators.

Since the display device in embodiments of the present invention includes the above described display substrate, it has high resolution and good display quality.

In the display substrate of the present invention, sub-pixels are arranged in unit of "set", therefore the number of sub-pixels between sub-pixels of the same color in different sets is increased, and the number of sub-pixels corresponding to each barrier section is increased. In such a way, the size of each sub-pixel (width or height) can be reduced and the resolution is improved under the condition that the width of barrier sections is un-changed.

It is to be understood that the described above are only illustrative embodiments and implementations for explaining the principle of the present invention, and the present invention is not limited thereto. For one of ordinary skill in the art, various modifications and improvements may be made without departing from the spirit and gist of embodiments of the present invention, all of which should fall within the protection scope of the present invention.

What is claimed is:

1. A display substrate, comprising:
    an array of a plurality of sub-pixels having at least three colors, wherein the sub-pixels of each color constitute a plurality of sub-pixel sets, each of the sub-pixel sets includes at least two sub-pixels of the same color and arranged adjacently in a same row or a same column in a first direction, and sub-pixel sets of different colors are arranged alternately in the same row or the same column in the first direction, and a plurality of pixel units, each of the plurality of pixel units including two adjacent sub-pixels of different colors from two adjacent sub-pixel sets and one sub-pixel of different color from another sub-pixel set spaced apart from the two adjacent sub-pixels by one sub-pixel in the same row or the same column.

2. The display substrate according to claim 1, wherein the first direction is a row or a column direction.

3. The display substrate according to claim 1, wherein numbers of sub-pixels included in each of the sub-pixel sets are identical.

4. The display substrate according to claim 1, wherein each of the sub-pixel set comprises two sub-pixels.

5. The display substrate according to claim 1, wherein the sub-pixel sets of different colors are arranged alternately in the row direction; and the sub-pixel sets of different colors are arranged alternately in the column direction.

6. The display substrate according to claim 1, wherein the display substrate is an OLED display substrate, and each of the sub-pixels includes an OLED, OLEDs of sub-pixels with different colors have organic light emitting layers of different materials, and OLEDs of sub-pixels with the same color have organic light emitting layers formed in a single evaporation process.

7. The display substrate according to claim 6, wherein the OLEDs of sub-pixels with different colors have organic light emitting layers of different materials.

8. The display substrate according to claim 6, wherein the OLEDs of sub-pixels with the same color have organic light emitting layers formed in a single evaporation process.

9. The display substrate according to claim 2, wherein numbers of sub-pixels included in each of the sub-pixel sets are identical.

10. The display substrate according to claim 2, wherein each of the sub-pixel set comprises two sub-pixels.

11. The display substrate according to claim 3, wherein each of the sub-pixel set comprises two sub-pixels.

12. The display substrate according to claim 2, wherein the sub-pixel sets of different colors are arranged alternately in the row direction; and the sub-pixel sets of different colors are arranged alternately in the column direction.

13. The display substrate according to claim 3, wherein the sub-pixel sets of different colors are arranged alternately in the row direction; and the sub-pixel sets of different colors are arranged alternately in the column direction.

14. The display substrate according to claim 1, wherein each row or column sub-pixel sets are disposed staggeredly by a distance of one sub-pixel with respect to adjacent rows or columns of sub-pixel sets; or the sub-pixels sets of different colors are arranged in a triangle arrangement.

15. A method of driving a display substrate, wherein the display substrate comprises:
an array of a plurality of sub-pixels having at least three colors, wherein the sub-pixels of each color constitute a plurality of sub-pixel sets, each of the sub-pixel sets includes at least two sub-pixels of the same color and arranged adjacently in a same row or a same column in a first direction, and sub-pixel sets of different colors are arranged alternately in the same row or the same column in the first direction, and a plurality of pixel units, each of the plurality of pixel units including two adjacent sub-pixels of different colors from two adjacent sub-pixel sets and one sub-pixel of different color from other sub-pixel set spaced apart from the two adjacent sub-pixels by one sub-pixel in the same row or the same column; comprising:
providing a driving signal for each of the sub-pixels in each of the plurality of pixel units for displaying.

16. The method of driving the display substrate according to claim 15, wherein any one sub-pixel only belongs to one pixel unit.

17. The method of driving the display substrate according to claim 15, wherein the plurality of sub-pixels of each of the pixel units are located in a plurality of adjacent sub-pixel sets respectively.

18. The method of driving the display substrate according to claim 15, wherein at least some of the sub-pixels are shared by two adjacent pixel units.

19. A display device, comprising:
a display substrate, comprising:
an array of a plurality of sub-pixels having at least three colors, wherein the sub-pixels of each color constitute a plurality of sub-pixel sets, each of the sub-pixel sets includes at least two sub-pixels of the same color and arranged adjacently in a same row or a same column in a first direction, and sub-pixel sets of different colors are arranged alternately in the same row or the same column in the first direction, and a plurality of pixel units, each of the plurality of pixel units including two adjacent sub-pixels of different colors from two adjacent sub-pixel sets and one sub-pixel of different color from other sub-pixel set spaced apart from the two adjacent sub-pixels by one sub-pixel in the same row or the same column.

20. The display device according to claim 19, wherein each row or column sub-pixel sets are disposed staggeredly by a distance of one sub-pixel with respect to adjacent rows or columns of sub-pixel sets; or the sub-pixels sets of different colors are arranged in a triangle arrangement.

* * * * *